United States Patent
Son et al.

(10) Patent No.: US 9,532,443 B2
(45) Date of Patent: Dec. 27, 2016

(54) COMPOSITE ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Soo Hwan Son, Suwon-Si (KR); Myeong Gi Kim, Suwon-Si (KR); Min Kyoung Cheon, Suwon-Si (KR); Yu Jin Choi, Suwon-Si (KR); Ho Yoon Kim, Suwon-Si (KR); So Yeon Song, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 115 days.

(21) Appl. No.: 14/674,765

(22) Filed: Mar. 31, 2015

(65) Prior Publication Data

US 2016/0007439 A1   Jan. 7, 2016

(30) Foreign Application Priority Data

Jul. 2, 2014   (KR) .................. 10-2014-0082558

(51) Int. Cl.
*H01G 4/40* (2006.01)
*H05K 1/02* (2006.01)
(Continued)

(52) U.S. Cl.
CPC .......... *H05K 1/023* (2013.01); *H01F 27/2804* (2013.01); *H01F 27/29* (2013.01);
(Continued)

(58) Field of Classification Search
None
See application file for complete search history.

(56) References Cited

U.S. PATENT DOCUMENTS

| | | | | |
|---|---|---|---|---|
| 6,985,712 B2* | 1/2006 | Yamakawa | ............... | H01P 1/15 333/185 |
| 2003/0030510 A1 | 2/2003 | Sasaki et al. | | |

(Continued)

FOREIGN PATENT DOCUMENTS

| | | |
|---|---|---|
| JP | 11-087793 A | 3/1999 |
| JP | 2001-176728 A | 6/2001 |
| KR | 2003-0014586 A | 2/2003 |

*Primary Examiner* — Dion R Ferguson
(74) *Attorney, Agent, or Firm* — McDermott Will & Emery LLP

(57) ABSTRACT

A composite electronic component includes a composite body in which a capacitor and an inductor are coupled to each other, the capacitor including a ceramic body including a plurality of dielectric layers and first and second internal electrodes, and the inductor including a magnetic body including a coil part. An input terminal is disposed on a first side surface of the composite body and is connected to the coil part. An output terminal includes a first output terminal disposed on the first side surface of the composite body and connected to the coil part and a second output terminal disposed on a first end surface of the composite body and connected to the first internal electrodes. A ground terminal is disposed on a second end surface of the composite body and is connected to the second internal electrodes. The capacitor is coupled to a side surface of the inductor.

19 Claims, 10 Drawing Sheets

(51) Int. Cl.
    *H01F 27/29*     (2006.01)
    *H01F 27/28*     (2006.01)
    *H05K 1/18*      (2006.01)
    *H01G 4/30*      (2006.01)
    *H01G 4/232*     (2006.01)
    *H01G 4/12*      (2006.01)

(52) U.S. Cl.
    CPC .............. *H01G 4/232* (2013.01); *H01G 4/30* (2013.01); *H01G 4/40* (2013.01); *H05K 1/181* (2013.01); *H01F 2027/2809* (2013.01); *H01G 4/1227* (2013.01)

(56) References Cited

U.S. PATENT DOCUMENTS

| | | | |
|---|---|---|---|
| 2014/0313785 A1* | 10/2014 | Lee | H02M 3/33507 363/21.01 |
| 2015/0116966 A1* | 4/2015 | Lee | H01G 4/40 361/767 |
| 2015/0213960 A1* | 7/2015 | Moon | H01G 4/40 361/270 |
| 2015/0371780 A1* | 12/2015 | Moon | H01G 4/40 361/767 |
| 2015/0371781 A1* | 12/2015 | Choi | H01G 4/40 361/767 |
| 2016/0007439 A1* | 1/2016 | Son | H05K 1/023 361/767 |
| 2016/0014886 A1* | 1/2016 | Kim | H01G 4/40 361/767 |
| 2016/0042872 A1* | 2/2016 | Choi | H01G 4/40 361/270 |

* cited by examiner

COMPOSITE ELECTRONIC COMPONENT AND BOARD HAVING THE SAME

CROSS-REFERENCE TO RELATED APPLICATION

This application claims the priority and benefit of Korean Patent Application No. 10-2014-0082558 filed on Jul. 2, 2014, with the Korean Intellectual Property Office, the disclosure of which is incorporated herein by reference.

BACKGROUND

The present disclosure relates to a composite electronic component including a plurality of passive elements and a board having the same.

In accordance with consumer demand for electronic devices which are relatively thin and light, as well as for improvements in the performance thereof, electronic devices have been required to have significantly decreased sizes and increased functionality.

Electronic devices, as described above, include devices such as a power semiconductor-based power management integrated circuit (PMIC) serving to efficiently control and manage limited battery resources in order to satisfy various service requirements.

However, as electronic device has been implemented with the ability to perform various functions, the number of direct current (DC) to DC converters included in PMICs has increased, and the number of passive elements, required in the power input terminals and power output terminals of PMICs, has also increased.

In this case, a component disposition area in the electronic devices is inevitably increased, which may limit the miniaturization of electronic devices.

In addition, a significant amount of noise may be generated due to wiring patterns and peripheral circuits of the PMIC.

In order to solve the above-mentioned problems, research into a composite electronic component in which an inductor and a capacitor are vertically coupled to each other has been conducted, such that effects such as a decrease in a component disposition area within the electronic device and the suppression of noise generation have been obtained.

However, in the case of coupling the inductor and the capacitor to each other, external terminals of the inductor and the capacitor may interfere with each other, generating parasitic capacitance, such that a self resonance frequency (SRF) may be lowered, and a quality (Q) factor may be deteriorated.

In addition, a distance between the external terminals of the inductor and the capacitor may be reduced, such that a solder reflow defect may occur at the time of mounting the composite electronic component on a printed circuit board.

RELATED ART DOCUMENT (Patent Document 1) Korean Patent Laid-Open Publication No. 2003-0014586

SUMMARY

An aspect of the present disclosure may provide a composite electronic component in which a size of a component mounting area in a driving power supply system may be reduced, and a board having the same.

An aspect of the present disclosure may also provide a composite electronic component capable of suppressing the generation of noise in a driving power supply system, and a board having the same.

According to an aspect of the present disclosure, a composite electronic component may include: a composite body including a capacitor and an inductor coupled to each other, the capacitor including a ceramic body in which a plurality of dielectric layers and first and second internal electrodes disposed to face each other with respective dielectric layers interposed between the first and second internal electrodes are stacked, and the inductor including a magnetic body including a coil part; an input terminal disposed on a first side surface of the composite body in a width direction of the composite body; an output terminal including a first output terminal disposed on the first side surface of the composite body in the width direction and a second output terminal disposed on a first end surface of the composite body in a length direction of the composite body; and a ground terminal disposed on a second end surface of the composite body in the length direction, wherein the capacitor is coupled to a side surface of the inductor.

According to another aspect of the present disclosure, a composite electronic component may include: a power stabilization part including a composite body in which a capacitor and an inductor are coupled to each other, the capacitor including a ceramic body in which a plurality of dielectric layers and first and second internal electrodes disposed to face each other with respective dielectric layers interposed between the first and second internal electrodes are stacked, the inductor including a magnetic body including a coil part, and the capacitor being coupled to a side surface of the inductor; an input terminal disposed on a first side surface of the power stabilization part in a width direction of the power stabilization part; and an output terminal including first and second output terminals disposed on the first side surface of the power stabilization part in the width direction and a first end surface of the power stabilization part in a length direction of the power stabilization part, wherein the inductor suppresses an alternating current component of received power, and the capacitor decreases ripples in the received power.

According to another aspect of the present disclosure, a board having a composite electronic component may include a printed circuit board on which three or more electrode pads are disposed, the composite electronic component as described above, mounted on the printed circuit board, and solders connecting the electrode pads and the composite electronic component to each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
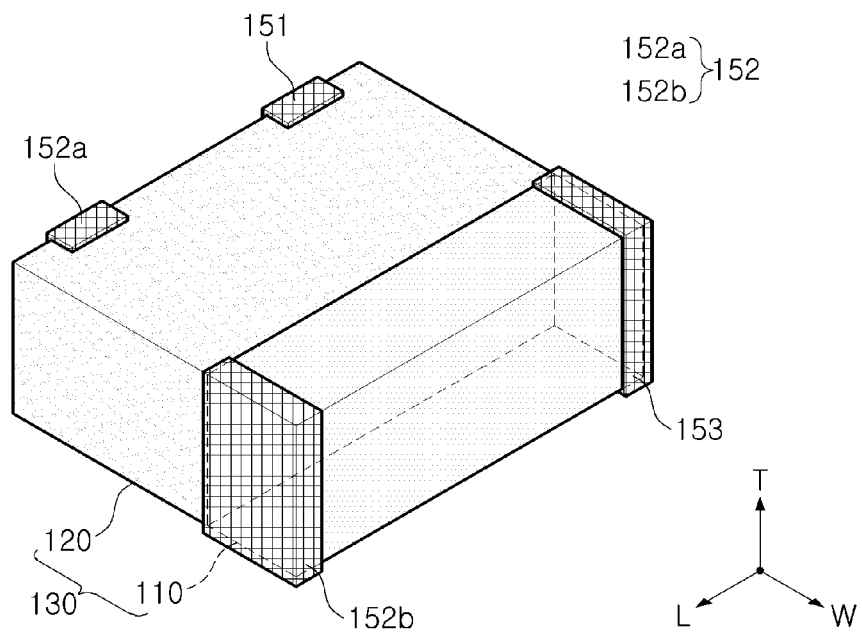
FIG. 1 is a perspective diagram schematically illustrating a composite electronic component according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

FIG. 1 is a perspective diagram schematically illustrating a composite electronic component according to an exemplary embodiment of the present disclosure.

Figure 2:
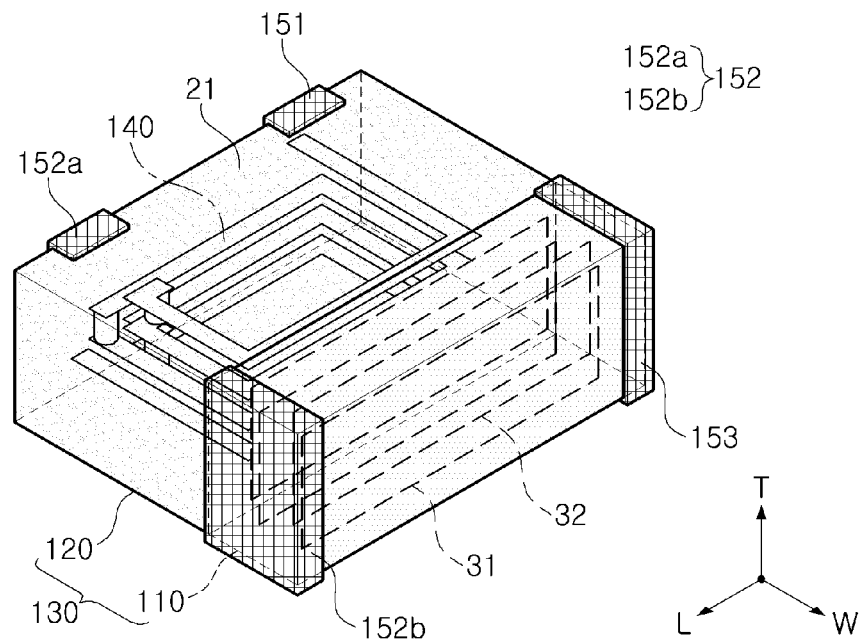
FIG. 2 is a schematic perspective diagram illustrating an internal portion of a composite electronic component according to a first exemplary embodiment of the present disclosure, as illustrated in FIG. 1.

FIG. 2 is a schematic perspective diagram illustrating an internal portion of a composite electronic component according to a first exemplary embodiment of the present disclosure, as illustrated in FIG. 1.

Figure 3:
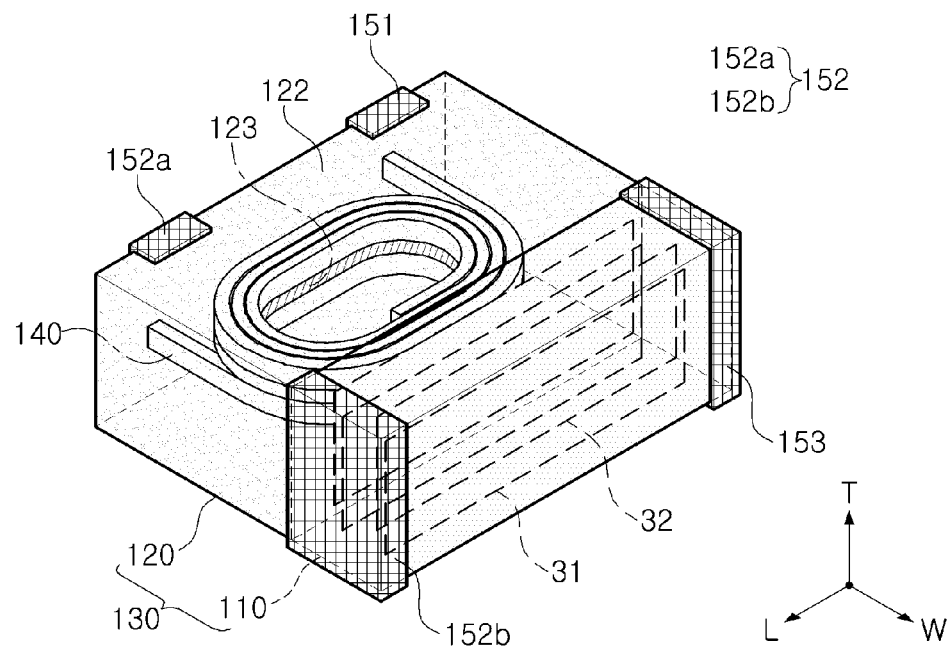
FIG. 3 is a schematic perspective diagram illustrating an internal portion of a composite electronic component according to a second exemplary embodiment of the present disclosure, as illustrated in FIG. 1.

FIG. 3 is a schematic perspective diagram illustrating an internal portion of a composite electronic component according to a second exemplary embodiment of the present disclosure, as illustrated in FIG. 1.

Figure 4:
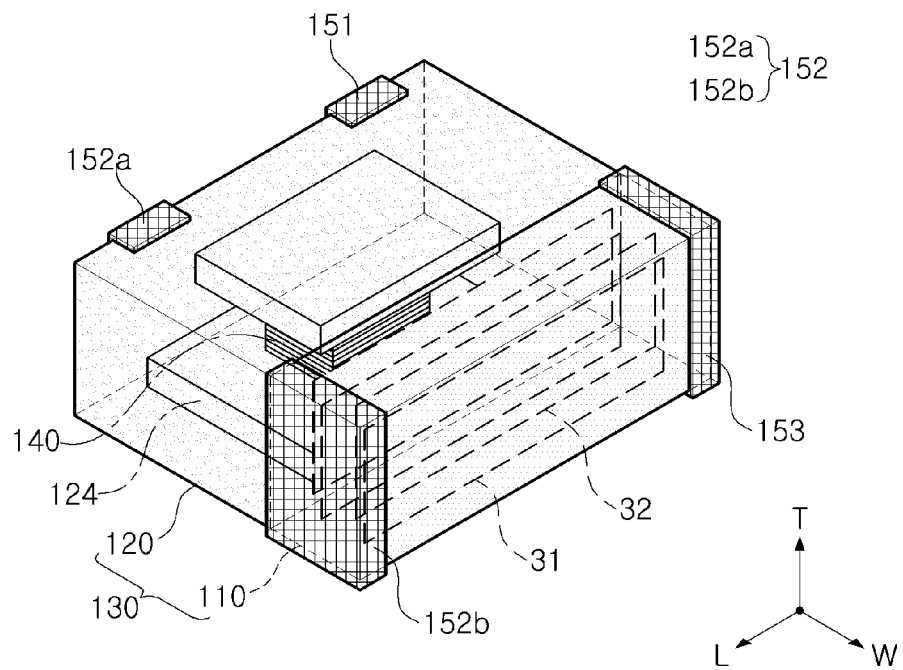
FIG. 4 is a schematic perspective diagram illustrating an internal portion of a composite electronic component according to a third exemplary embodiment of the present disclosure, as illustrated in FIG. 1.

FIG. 4 is a schematic perspective diagram illustrating an internal portion of a composite electronic component according to a third exemplary embodiment of the present disclosure, as illustrated in FIG. 1.

Figure 5:
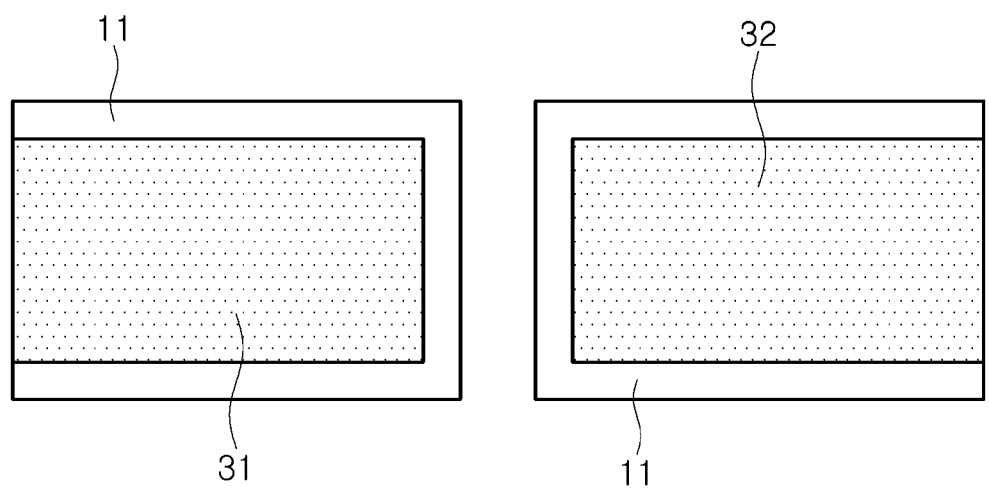
FIG. 5 is a plan diagram illustrating internal electrodes applicable to a multilayer ceramic capacitor of the composite electronic component illustrated in FIG. 1.

FIG. 5 is a plan diagram illustrating internal electrodes applicable to a multilayer ceramic capacitor of the composite electronic component illustrated in FIG. 1.

Referring to FIG. 1, in the composite electronic component according to an exemplary embodiment of the present disclosure, a 'length direction' refers to an 'L' direction of FIG. 1, a 'width direction' refers to a 'W' direction of FIG. 1, and a 'thickness direction' refers to a 'T' direction of FIG. 1.

Meanwhile, the length, width, and thickness directions of the composite electronic component may be the same as length, width, and thickness directions of a capacitor and an inductor, respectively, as described below.

In addition, in an exemplary embodiment of the present disclosure, the composite electronic component may have upper and lower surfaces opposing each other, first and second end surfaces in the length direction and first and second side surfaces in the width direction that connect the upper and lower surfaces to each other. A shape of the composite electronic component is not particularly limited, but may be a hexahedral shape as shown.

Further, the first and second end surfaces of the composite electronic component in the length direction and the first and second side surfaces thereof in the width direction may be defined as surfaces in the same directions as directions of first and second end surfaces of the capacitor and the inductor in the length direction and first and second side surfaces of the capacitor and the inductor in the width direction, respectively, as described below.

However, as illustrated in FIG. 1, the second side surface of the inductor in the width direction and the first side surface of the capacitor may be coupling surfaces coupled to each other.

Meanwhile, the composite electronic component has a form in which the capacitor and inductor are coupled to each other, and in the case in which the capacitor is coupled to the side surface of the inductor, the upper surface of the composite electronic component may be defined as upper surfaces of the inductor and the capacitor, and the lower surface of the composite electronic component may be defined as lower surfaces of the inductor and the capacitor.

In addition, the upper and lower surfaces may correspond to surfaces of the composite electronic component opposing each other in the thickness direction.

Referring to FIGS. 1 through 3, the composite electronic component 100 according to an exemplary embodiment of the present disclosure may include a composite body 130 including a capacitor 110 and an inductor 120 coupled to each other, wherein the capacitor includes a ceramic body in which a plurality of dielectric layers 11 and first and second internal electrodes 31 and 32 disposed to face each other with respective dielectric layers 11 interposed therebetween are stacked, and the inductor 120 includes a magnetic body including a coil part 140.

A shape of the composite body 130 is not particularly limited, but may be a hexahedral shape as shown.

The composite body 130 may be formed by coupling the capacitor 110 and the inductor 120, and a method of forming the composite body 130 is not particularly limited.

For example, the composite body 130 may be formed by coupling the capacitor 110 and the inductor 120 that are separately manufactured using a conductive adhesive, a resin, or the like, but is not particularly limited thereto.

Particularly, the adhesive or resin used to couple the capacitor 110 and the inductor 120 to each other may contain, for example, an epoxy resin, but is not limited thereto.

A method of coupling the capacitor 110 and the inductor 120 to each other using the conductive adhesive, the resin, or the like, is not particularly limited. For example, the capacitor 110 and the inductor 120 may be coupled to each other by applying, heating, and curing the conductive adhesive, the resin, or the like, onto a coupling surface of the capacitor 110 or the inductor 120.

Meanwhile, according to an exemplary embodiment of the present disclosure, the capacitor 110 may be coupled to the side surface of the inductor 120, but is not limited thereto. That is, the capacitor may be variously disposed.

Hereinafter, the capacitor 110 and the inductor 120 configuring the composite body 130 will be described in detail.

According to an exemplary embodiment of the present disclosure, the magnetic body configuring the inductor 120 may include a coil part 140.

The inductor 120 is not particularly limited. For example, the inductor 120 may be a multilayer type inductor, a thin film type inductor, or a winding type inductor.

The multilayer type inductor may be manufactured by thickly printing electrodes on thin ferrite or glass ceramic sheets, stacking several sheets on which coil patterns are printed, and connecting internal conducting wires to each other through via-holes.

The thin film type inductor may be manufactured by forming coil conducting wires on a ceramic substrate by thin film sputtering or plating and filling a ferrite material.

The winding type inductor may be manufactured by winding wires (coil conducting wires) around a core.

Referring to FIG. 2, in a composite electronic component according to a first exemplary embodiment of the present disclosure, the inductor 120 may be the multilayer type inductor.

In detail, the magnetic body may have a form in which a plurality of magnetic layers 21 on which conductive patterns are disposed are stacked, wherein the conductive patterns may configure the coil part 140.

Referring to FIG. 3, in a composite electronic component according to a second exemplary embodiment of the present disclosure, the inductor 120 may be the thin film type inductor.

In detail, the inductor 120 may have a thin film form in which the magnetic body includes an insulating substrate 123 and coils disposed on at least one surface of the insulating substrate 123.

The magnetic body may be formed by filling upper and lower portions of the insulating substrate 123 of which the coils are disposed on at least one surface with magnetic materials 122.

Referring to FIG. 4, in a composite electronic component according to a third exemplary embodiment of the present disclosure, the inductor 120 may be the winding type inductor.

In detail, in the inductor 120, the magnetic body may have a form in which it includes a core 124 and coils wound around the core 124.

Referring to FIGS. 2 through 4, the first and second internal electrodes 31 and 32 of the capacitor 110 may be stacked in a form in which they are vertical with respect to a mounted surface, but are not limited thereto.

The magnetic layer 21 and the magnetic material 122 may be formed of a Ni—Cu—Zn based material, a Ni—Cu—Zn—Mg based material, or a Mn—Zn ferrite based material, but are not limited thereto.

According to an exemplary embodiment of the present disclosure, the inductor 120 may be a power inductor that may be applied to a large amount of current.

The power inductor may mean a high efficiency inductor of which a change in inductance is small when a direct current is applied thereto, as compared to a general inductor.

That is, it may be considered that the power inductor has DC bias characteristics (a change in inductance depending on application of a direct current) in addition to functions of a general inductor.

That is, the composite electronic component according to an exemplary embodiment of the present disclosure, which is used in a power management integrated circuit (PMIC), may include the power inductor, a high efficiency inductor of which an inductance change is smaller when the DC current is applied thereto, rather than a general inductor.

The coil part 140 of the inductor 120 has two exposed portions exposed to the first side surface of the composite body 130 in the width direction and spaced apart from each other.

As described below, the two exposed portions of the coil part 140 may be connected to an input terminal 151 and a first output terminal 152a, respectively.

Meanwhile, the ceramic body configuring the capacitor 110 may be formed by stacking a plurality of dielectric layers 11, and a plurality of internal electrodes 31 and 32 (sequentially first and second internal electrodes) may be separately disposed in the ceramic body with respective dielectric layers interposed therebetween.

The dielectric layer 11 may be formed by sintering a ceramic green sheet containing ceramic powder, an organic solvent, and an organic binder. The ceramic powder, which is a high k material, may be formed of a barium titanate ($BaTiO_3$) based material, a strontium titanate ($SrTiO_3$) based material, or the like, but is not limited thereto.

According to an exemplary embodiment of the present disclosure, the first and second internal electrodes 31 and 32 may be alternately exposed to the first and second end surfaces of the composite body 130 in the length direction, but are not necessarily limited thereto.

According to an exemplary embodiment of the present disclosure, the first and second internal electrodes 31 and 32 may be formed of a conductive paste containing a conductive metal.

The conductive metal may be nickel (Ni), copper (Cu), palladium (Pd), or an alloy thereof, but is not limited thereto.

The first and second internal electrodes 31 and 32 may be printed on the ceramic green sheets forming the dielectric layer 11, using conductive pastes by a printing method such as screen printing method or a gravure printing method.

The ceramic green sheets on which the internal electrodes are printed may be alternately stacked and sintered, thereby forming the ceramic body.

Although pattern shapes of the first and second internal electrodes 31 and 32 are illustrated in FIG. 5, the present disclosure is not limited thereto, and the pattern shapes may be variously changed.

The capacitor may serve to control a voltage supplied from a power management integrated circuit (PMIC).

The composite electronic component 100 according to an exemplary embodiment of the present disclosure may include an input terminal 151 disposed on the first side surface of the composite body 130 in the width direction and connected to the coil part 140 of the inductor 120; an output terminal 152 including a first output terminal 152a disposed on the first side surface of the composite body 130 in the width direction and connected to the coil part 140 of the inductor 120 and a second output terminal 152b disposed on the first end surface of the composite body 130 in the length direction and connected to the first internal electrodes 31 of the capacitor 110; and a ground terminal 153 disposed on the second end surface of the composite body 130 in the length direction and connected to the second internal electrodes 32 of the capacitor 110.

The input terminal 151 and the first output terminal 152a may be connected to the coil part 140 of the inductor 120, thereby serving as an inductor in the composite electronic component.

In addition, the second output terminal 152b may be connected to the first internal electrodes 31 of the capacitor 110, and the second internal electrodes 32 of the capacitor 110 may be connected to the ground terminal 153, thereby serving as the capacitor in the composite electronic component.

The input terminal 151, the output terminal 152, and the ground terminal 153 may be formed of a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the input terminal 151, the output terminal 152, and the ground terminal 153 is not particularly limited. That is, the input terminal 151, the output terminal 152, and the ground terminal 153 may be formed by dipping the ceramic body or be formed by another method such as a printing method, a plating method, or the like.

Figure 6:
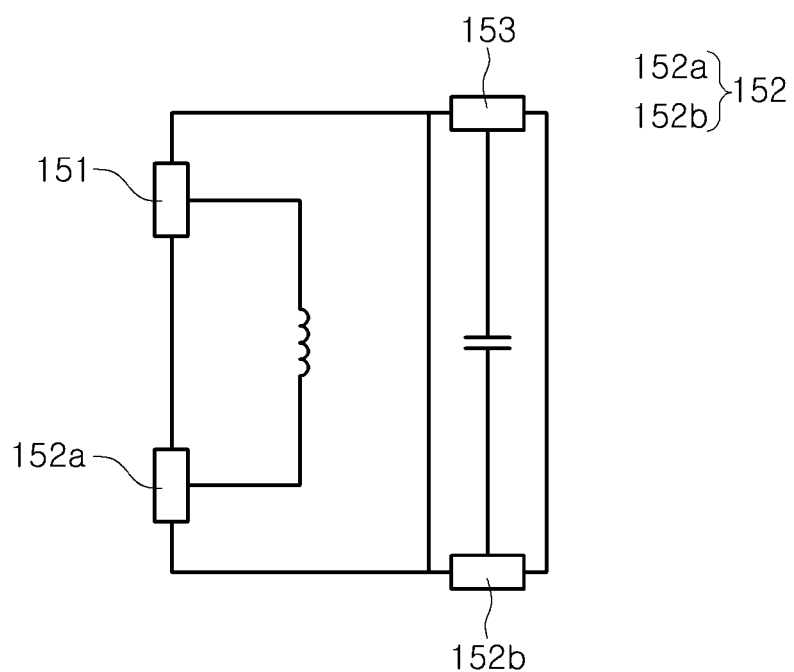
FIG. 6 is an equivalent circuit diagram of the composite electronic component illustrated in FIG. 1.

FIG. 6 is an equivalent circuit diagram of the composite electronic component illustrated in FIG. 1.

Referring to FIG. 6, in the composite electronic component according to an exemplary embodiment of the present disclosure, the inductor 120 and the capacitor 110 are coupled to each other unlike the related art, the inductor 120 and the capacitor 110 may be designed to have a shortest distance therebetween, such that noise may be decreased.

In addition, the inductor 120 and the capacitor 110 are coupled to each other, such that a mounting area in the PMIC is significantly decreased, whereby a space in which the inductor and the capacitor are mounted may be easily secured.

In addition, a cost required for mounting the composite electronic component may be decreased.

Meanwhile, as electronic devices include various functions, the number of direct current (DC) to DC converters included in the PMIC has increased. In addition, the number of passive elements that should be included in a power input terminal and a power output terminal of the PMIC has also increased.

In this case, a component disposition area in the electronic devices can not but increase, which may limit miniaturization of the electronic devices.

In addition, noise may be significantly generated due to wiring patterns of the PMIC and peripheral circuits of the PMIC.

In order to solve the above-mentioned problems, research into a composite electronic component in which an inductor and a capacitor are vertically coupled to each other has been conducted, such that effects such as a decrease in a component disposition area in the electronic device and suppression of generation of the noise have been obtained.

However, in the case of vertically disposing the inductor and the capacitor or disposing the external electrodes of the inductor and the capacitor to be adjacent to each other, the external terminals of the inductor and the capacitor interfere with each other, which may generate parasitic capacitance, such that a self resonance frequency (SRF) may move toward a low frequency, and a Q factor may be deteriorated.

In the case in which the SRF moves toward the low frequency as described above, a frequency region of the inductor that may be used in an exemplary embodiment of the present disclosure may become narrow.

That is, since a function of the inductor is not exhibited in a high frequency region of the SRF or more, in the case in which the SRF moves toward the low frequency, there is a problem that a usable frequency region is limited.

However, according to an exemplary embodiment of the present disclosure, since the capacitor 110 may be coupled to the side surface of the inductor 120, and the input terminal 151 and the first output terminal 152a disposed on the inductor 120 may be disposed far away from the second output terminal 152b and the ground terminal 153 disposed on the capacitor 110, a deterioration phenomenon of components due to parasitic capacitance may be decreased.

That is, according to an exemplary embodiment of the present disclosure, the inductor 120 and the capacitor 110 may be designed to have the shortest distance therebetween. Therefore, noise may be decreased, and the change in the SRF may be prevented, such that a range of the inductor that may be used in the low frequency may not be limited.

Meanwhile, in accordance with miniaturization of the composite electronic component, an internal magnetic layer blocking a magnetic field of the inductor is also thinned, such that a quality (Q) factor is deteriorated.

The Q factor means loss of an element or a decrease in efficiency of the element. A large Q value means that loss is low and efficiency is high.

That is, according to an exemplary embodiment of the present disclosure, since the capacitor 110 may be coupled to the side surface of the inductor 120, and the input terminal 151 and the first output terminal 152a disposed on the inductor 120 may be disposed far away from the second output terminal 152b and the ground terminal 153 disposed on the capacitor 110, mutual influence of respective components may be significantly decreased, such that deterioration in the Q factor of the component may be prevented.

A detailed description relating to the self resonant frequency (SRF) and the Q factor will be described below.

Furthermore, at the time of mounting the composite electronic component on a board, occurrence of a solder reflow defect may be prevented by increasing the distance between the external terminals disposed on the inductor 120 and the capacitor 110.

Figure 7:
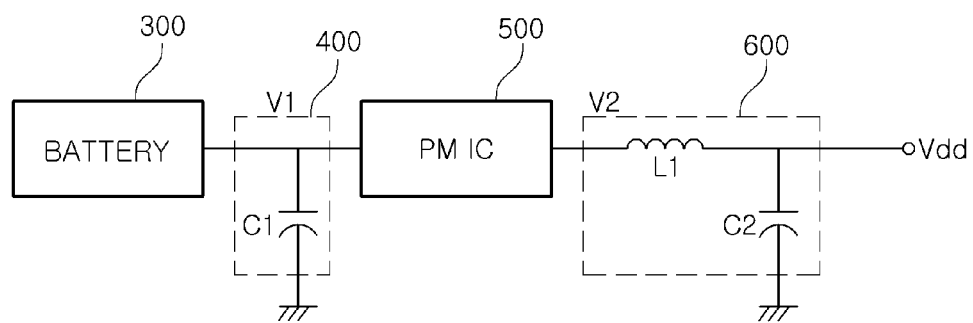
FIG. 7 is a diagram illustrating a driving power supply system supplying driving power to a predetermined terminal requiring driving power through a battery and a power management part.

FIG. 7 is a diagram illustrating a driving power supply system supplying driving power to a predetermined terminal requiring driving power through a battery and a power management part.

Referring to FIG. 7, the driving power supply system may include a battery 300, a first power stabilization part 400, a power management part 500, and a second power stabilization part 600.

The battery 300 may supply power to the power management part 500. Here, the power supplied to the power management part 500 by the battery 300 will be defined as first power.

The first power stabilization part 400 may stabilize the first power V1 and supply the stabilized first power to the power management part. In detail, the first power stabilization part 400 may include a capacitor C1 disposed between a connection terminal between the battery 300 and the power management part 500 and a ground. The capacitor C1 may decrease noise included in the first power.

In addition, the capacitor C1 may be charged with electric charges. Further, in the case in which the power management part 500 instantaneously consumes a large amount of current, the capacitor C1 may discharge the electric charges charged therein, thereby suppressing a voltage variation in the power management part 500.

The capacitor C1 may be a high capacitance capacitor in which the number of stacked dielectric layers is 300 or more.

The power management part 500 may serve to convert power supplied to an electronic device into power suitable for the electronic device and distribute, charge, and control the power. Therefore, the power management part 500 may generally include a direct current (DC) to DC converter.

In addition, the power management part 500 may be implemented by a power management integrated circuit (PMIC).

The power management part 500 may convert the first power V1 into second power V2. The second power V2 may be required by an active element such as an integrated circuit (IC), or the like, connected to an output terminal of the power management part 500 to receive driving power from the power management part 500.

The second power stabilization part 600 may stabilize the second power V2 and transfer the stabilized second power to an output terminal Vdd. An active element such as an integrated circuit (IC), or the like, receiving the driving power from the power management part 500 may be connected to the output terminal Vdd.

In detail, the second power stabilization part 600 may include an inductor L1 connected in series with the power management part 500 and the output terminal Vdd between the power management part 500 and the output terminal Vdd. In addition, the second power stabilization part 600 may include a capacitor C2 disposed between a connection terminal between the power management part 500 and the output terminal Vdd and a ground.

The second power stabilization part 600 may decrease noise included in the second power V2.

In addition, the second power stabilization part 600 may stably supply the power to the output terminal Vdd.

The inductor L1 may be a power inductor that may be applied to a large amount of current.

The power inductor may mean a high efficiency inductor of which a change in inductance is small when a direct current is applied thereto, as compared to a general inductor. That is, it may be considered that the power inductor has DC bias characteristics (a change in inductance depending on application of a direct current) in addition to functions of a general inductor.

In addition, the capacitor C2 may be a high capacitance capacitor.

Figure 8:
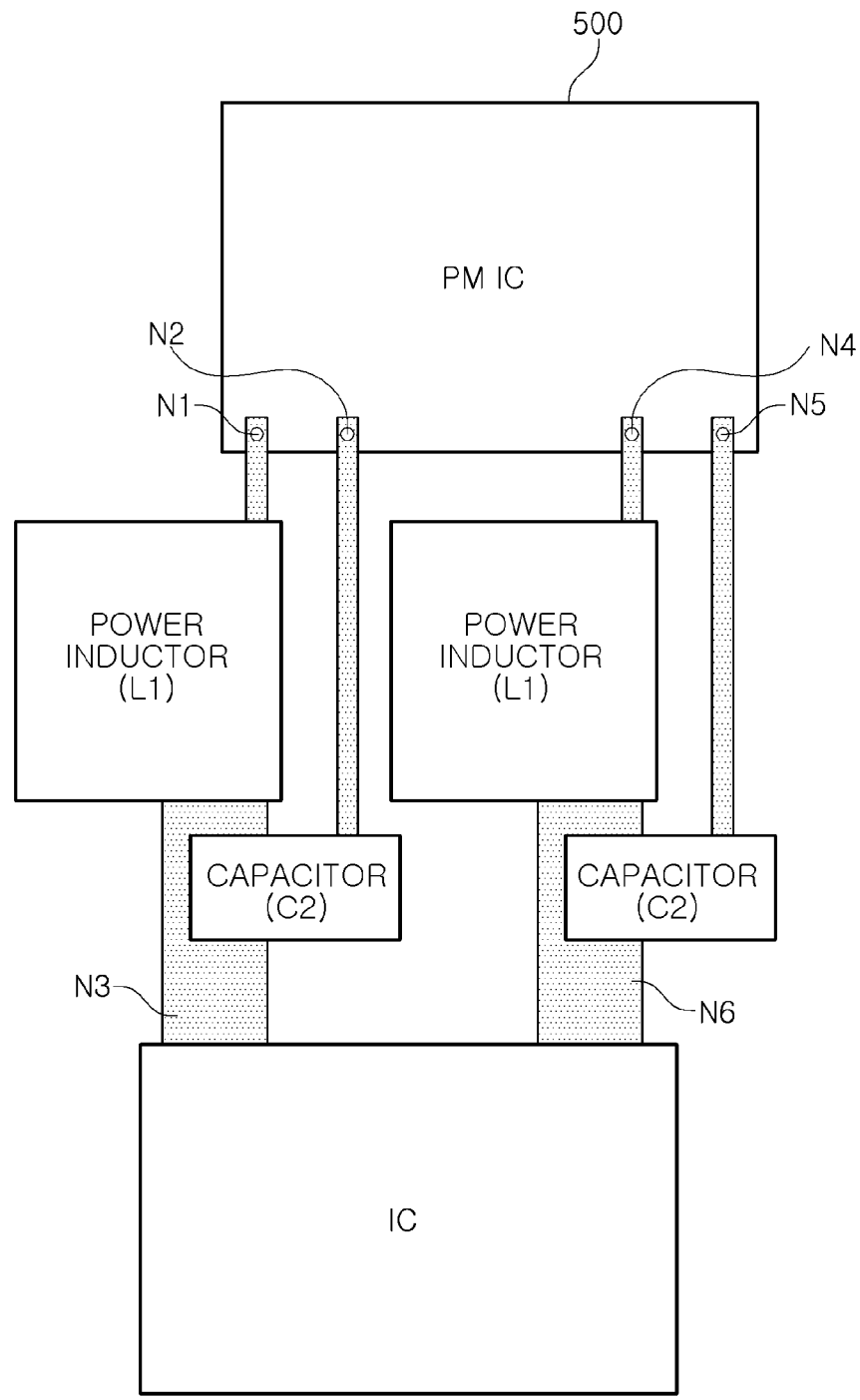
FIG. 8 is a diagram illustrating a pattern in which the driving power supply system is disposed.

FIG. 8 is a diagram illustrating a pattern in which the driving power supply system is disposed.

Referring to FIG. 8, a pattern in which the power management part 500, the power inductor L1, and the second capacitor C2 are disposed may be confirmed.

Generally, the power management part 500 (PMIC) may include several to several ten DC to DC converters. Further, in order to implement a function of the DC to DC converter, a power inductor and a high capacitance capacitor may be required in each of the DC to DC converters.

Referring to FIG. 8, the power management part 500 may have predetermined terminals N1 and N2. The power management part 500 may receive power from the battery and convert the power using the DC to DC converter. In addition, the power management part 500 may supply the converted power through the first terminal N1. The second terminal N2 may be a ground terminal.

Here, the first power inductor L1 and the second capacitor C2 may receive power from the first terminal N1, stabilize the power, and supply driving power through a third terminal N3. Therefore, the first power inductor L1 and the second capacitor C2 may serve as the second power stabilization part.

Since fourth to sixth terminals N4 to N6 illustrated in FIG. 8 perform the same functions as those of the first to third terminals N1 to N3, a detailed description thereof will be omitted.

In a pattern design of the driving power supply system, the important consideration is that the power management part, the power inductor, and the high capacitance capacitor need to be disposed as closely to each other as possible. In addition, it may be required to design a wiring of a power line to be short and thick.

The reason is that the requirements as described above need to be satisfied in order to decrease a component disposition area and suppress generation of noise.

In the case in which the number of output terminals of the power management part 500 is small, there is no problem in disposing the power inductor and the high capacitance capacitor to be close to each other. However, in the case in which several output terminals of the power management part 500 need to be used, the power inductor and the high capacitance capacitor may not be normally disposed due to density of the components. In addition, a situation in which the power inductor and the high capacitance capacitor should be disposed in a non-optimal state depending on a priority of power may occur.

For example, since sizes of the power inductor and the high capacitance capacitor are large, a situation in which a power line and a signal line are inevitably elongated at the time of actually disposing the power inductor and the high capacitance capacitor may occur.

In the case in which the power inductor and the high capacitance capacitor are disposed in the non-optimal state, an interval between respective elements and the power lines may become long, thereby generating noise. The noise may have a negative influence on the power supply system.

Figure 9:
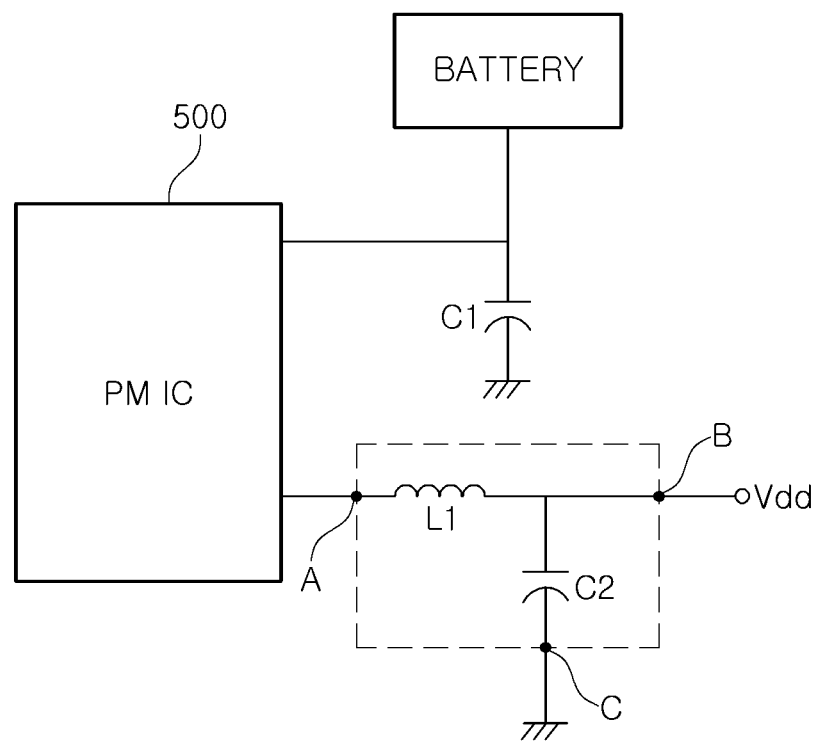
FIG. 9 is a circuit diagram of the composite electronic component according to an exemplary embodiment of the present disclosure.

FIG. 9 is a circuit diagram of the composite electronic component according to an exemplary embodiment of the present disclosure.

Referring to FIG. 9, a composite electronic component 700 may include an input terminal part A (input terminal), a power stabilization part, an output terminal part B (output terminal), and a ground terminal part C (ground terminal).

The power stabilization part may include a power inductor L1 and a second capacitor C2.

The composite electronic component 700 is an element capable of performing the function of the second power stabilization part as described above.

The input terminal part A may receive power converted by the power management part 500.

The power stabilization part may stabilize power supplied from the input terminal part A.

The output terminal part B may supply the stabilized power to an output terminal Vdd.

The ground terminal part C may connect the power stabilization part to a ground.

Meanwhile, the power stabilization part may include the power inductor L1 connected between the input terminal part A and the output terminal part B and the second capacitor C2 connected between the ground terminal part C and the output terminal part.

Referring to FIG. 9, the power inductor L1 and the second capacitor C2 share the output terminal part B with each other, whereby an interval between the power inductor L1 and the second capacitor C2 may be decreased.

As described above, the composite electronic component 700 may be formed by implementing the power inductor and the high capacitance capacitor provided in an output power terminal of the power management part 500 as a single component. Therefore, in the composite electronic component 700, a degree of integration of the element is improved.

Figure 10:
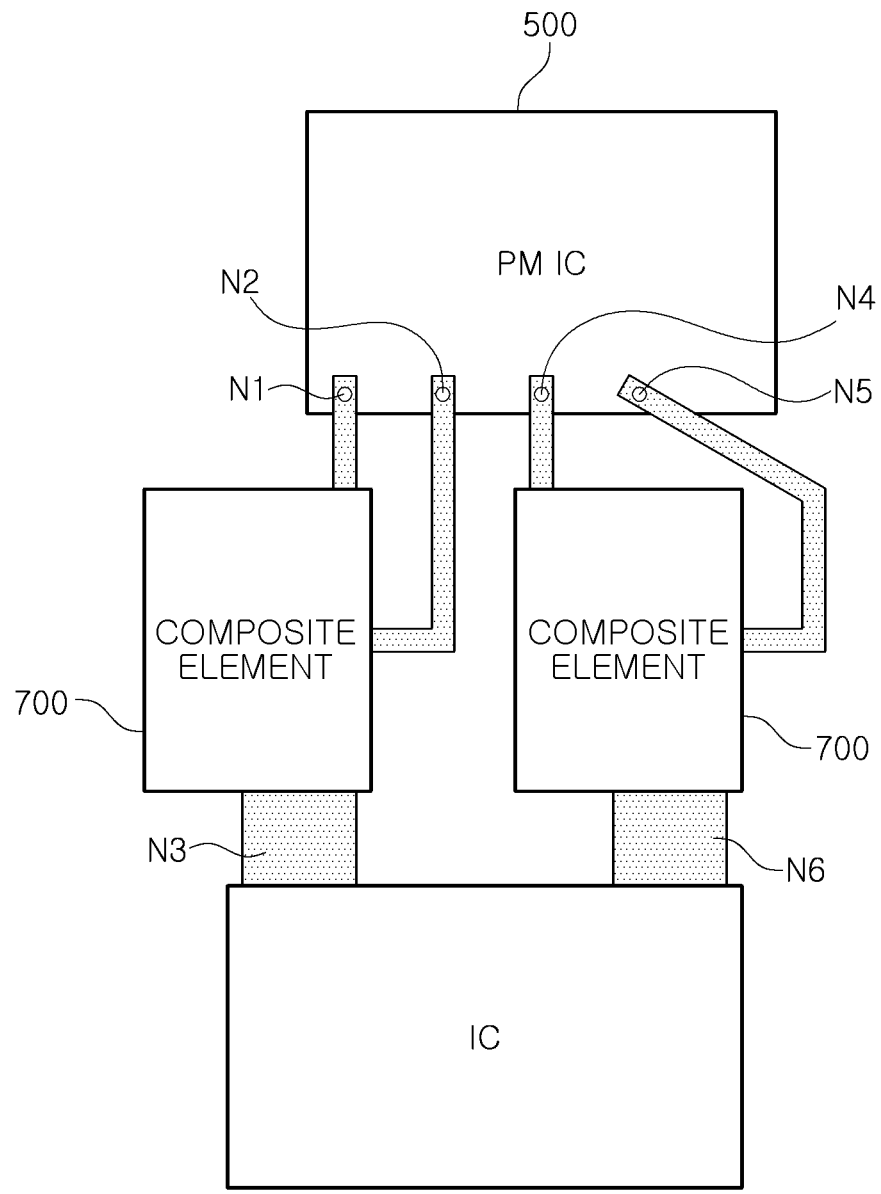
FIG. 10 is a diagram illustrating a pattern in which a driving power supply system using the composite electronic component according to an exemplary embodiment of the present disclosure is disposed.

FIG. 10 is a diagram illustrating a pattern in which a driving power supply system using the composite electronic component according to an exemplary embodiment of the present disclosure is disposed.

Referring to FIG. 10, it may be confirmed that the second capacitor C2 and the power inductor L1 illustrated in FIG. 8 have been replaced by the composite electronic component according to an exemplary embodiment of the present disclosure.

As described above, the composite electronic component may serve the function of the second power stabilization part.

In addition, the second capacitor C2 and the power inductor L1 are replaced by the composite electronic component according to an exemplary embodiment of the present disclosure, whereby a length of a wiring may be significantly decreased. In addition, the number of disposed elements is decreased, such that the elements may be optimally disposed.

That is, according to an exemplary embodiment of the present disclosure, the power management part, the power inductor, and the high capacitance capacitor may be disposed as closely to each other as possible, the wiring of the power line may be designed to be short and thick, such that noise may be decreased.

Meanwhile, in order to satisfy customer's demands, electronic device manufacturers have been made an effort to decrease a size of a printed circuit board (PCB) included in an electronic device. Therefore, it has been required to increase a degree of integration of an integrated circuit (IC) mounted in the PCB. This requirement may be satisfied by configuring a plurality of elements as a single composite component, as in the composite electronic component according to an exemplary embodiment of the present disclosure.

In addition, according to an exemplary embodiment of the present disclosure, two components (the second capacitor and the power inductor) are implemented as the single composite electronic component, such that a mounting area in a printed circuit board (PCB) may be decreased. According to the present embodiment, the mounting area may be decreased by about 30 to 50% as compared to an existing disposition pattern.

Further, according to an exemplary embodiment of the present disclosure, the power management part 500 may supply power to an IC receiving driving power by a shortest wiring.

In addition, in the composite electronic component according to an exemplary embodiment of the present disclosure, since the capacitor 110 is coupled to the side surface of the inductor 120, and the input terminal 151 and the first output terminal 152*a* disposed on the inductor 120 may be disposed farthest away from the second output terminal 152*b* and the ground terminal 153 disposed on the capacitor 110, such that a deterioration phenomenon of components due to parasitic capacitance may be decreased, and deterioration in the Q factor of the component may be prevented.

Furthermore, at the time of mounting the composite electronic component on a board, occurrence of the solder reflow defect may be prevented by increasing the distance between the external terminals disposed on the inductor 120 and the capacitor 110.

Board Having Composite Electronic Component

Figure 11:
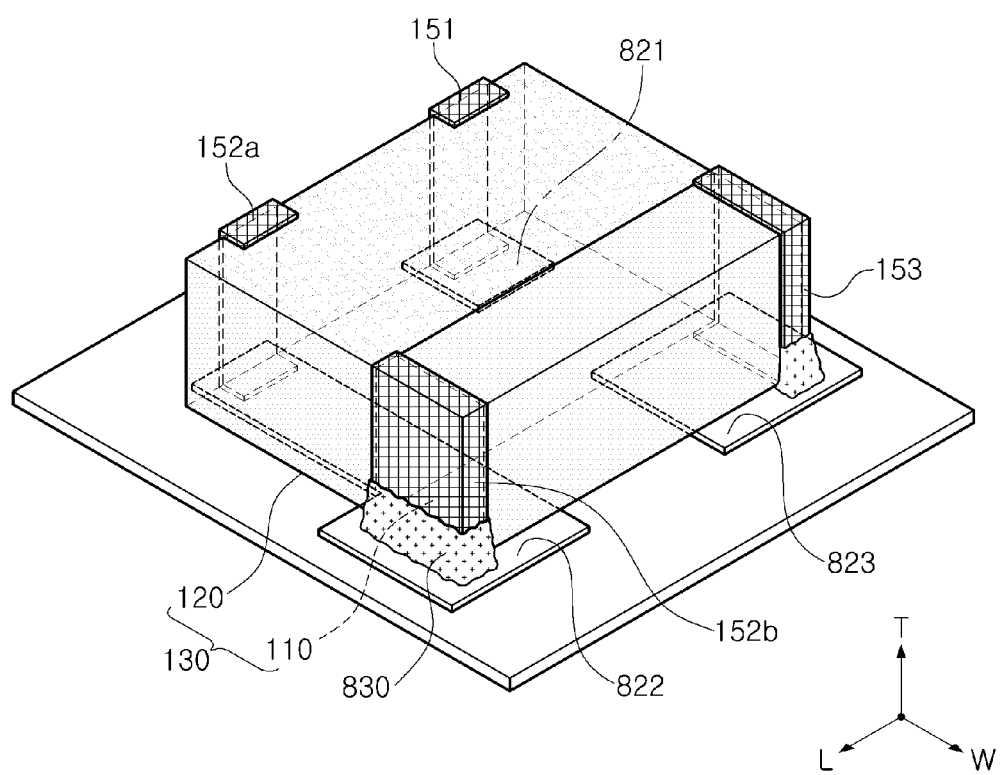
FIG. 11 is a perspective diagram illustrating a form in which the composite electronic component of FIG. 1 is mounted on a printed circuit board.

FIG. 11 is a perspective diagram illustrating a form in which the composite electronic component of FIG. 1 is mounted on a printed circuit board.

Referring to FIG. 11, aboard 800 having a composite electronic component 100 according to the present exemplary embodiment may include a printed circuit board 810 on which the composite electronic component 100 is mounted, and three or more electrode pads 821 to 823 disposed on an upper surface of the printed circuit board 810.

The electrode pad may be composed of first to third electrode pads 821 to 823 connected to the input terminal 151, the output terminal 152, and the ground terminal 153 of the composite electronic component, respectively.

In this case, the composite electronic component 100 may be electrically connected to the printed circuit board 810 by solders 830 in a state in which the input terminal 151, the output terminal 152, and the ground terminal 153 of the composite electronic component 100 are positioned on the first to third electrode pads 821 to 823 to contact the first to third electrode pads 821 to 823, respectively.

Figure 12:
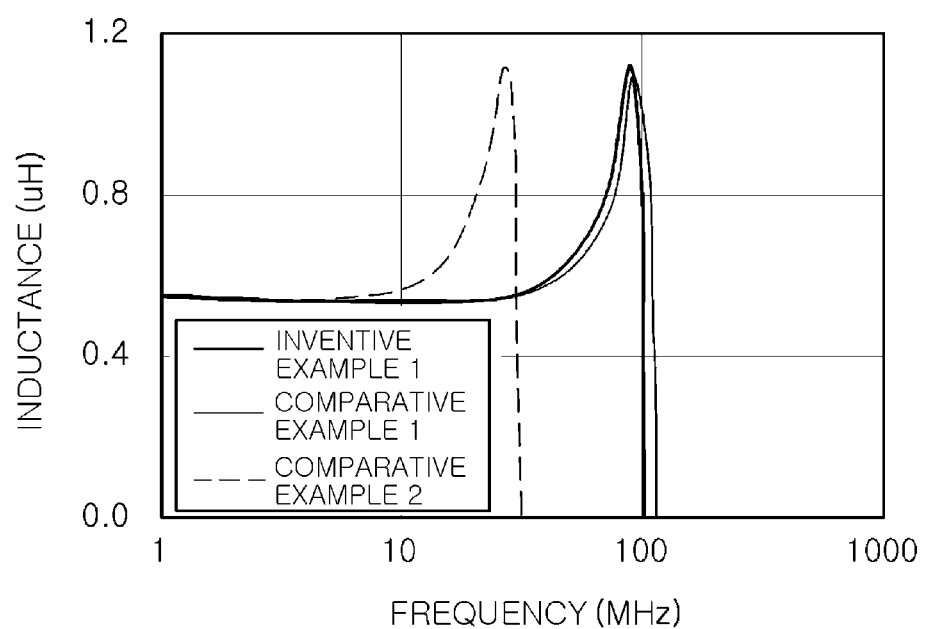
FIG. 12 is a graph illustrating a change in a self resonant frequency (SRF) according to Inventive Examples and Comparative Examples of the present disclosure.

FIG. 12 is a graph illustrating a change in a self resonant frequency (SRF) according to Inventive Examples and Comparative Examples of the present disclosure.

Referring to FIG. 12, Inventive Example 1 indicates a composite electronic component in which a capacitor was coupled to a side surface of an inductor according to an exemplary embodiment of the present disclosure and an input terminal, an output terminal, and a ground terminal were disposed far away from each other, Comparative Example 1 indicates the case of using a power inductor alone, and Comparative Example 2 indicates the case in which a capacitor and an inductor were vertically coupled to each other.

Referring to the graph, it may be appreciated that in Inventive Example 1 in which the capacitor was coupled to the side surface of the inductor and the input terminal, the output terminal, and the ground terminal were disposed far away from each other, a self resonant frequency (SRF) was almost equal to that in Comparative Example 1 in which the power inductor was used alone.

On the contrary, it may be appreciated that in Comparative Example 2 in which the inductor and the capacitor were vertically coupled to each other, a self resonant frequency (SRF) moved toward a low frequency region, such that a use range of the inductor was limited.

Figure 13:
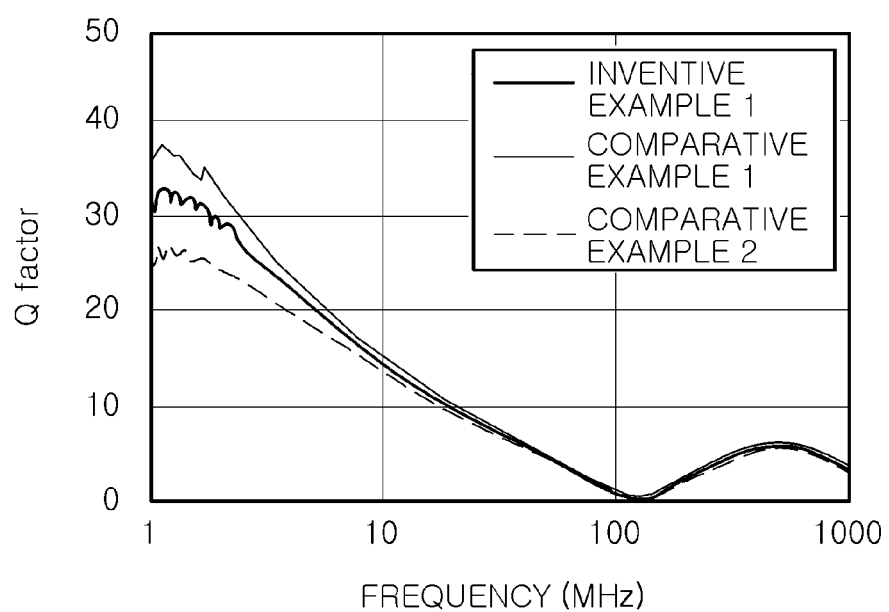
FIG. 13 is a graph illustrating a change in Q factor according to Inventive Examples and Comparative Examples of the present disclosure.

FIG. 13 is a graph illustrating a change in Q factor according to Inventive Examples and Comparative Examples of the present disclosure.

Referring to FIG. 13, Inventive Example 1 indicates a composite electronic component in which a capacitor was coupled to a side surface of an inductor according to an exemplary embodiment of the present disclosure and an input terminal, an output terminal, and a ground terminal were disposed far away from each other, Comparative Example 1 indicates the case of using a power inductor alone, and Comparative Example 2 indicates the case in which a capacitor and an inductor were vertically coupled to each other.

Referring to the graph, it may be appreciated that in Inventive Example 1 in which the capacitor was coupled to the side surface of the inductor and the input terminal, the output terminal, and the ground terminal were disposed far away from each other, the Q factor was almost equal to that in Comparative Example 1 in which the power inductor was used alone.

On the contrary, it may be appreciated that in Comparative Example 2 in which the inductor and the capacitor were vertically coupled to each other, Q factor was decreased as compared to Inventive Examples 1 indicating the composite electronic component in which the capacitor was coupled to the side surface of the inductor, and the input terminal, the output terminal, and the ground terminal were disposed far away from each other, and Comparative Example 1 indicating the case of using the power inductor alone.

As set forth above, according to exemplary embodiments of the present disclosure, the composite electronic component capable of decreasing a component mounting area in the driving power supply system may be provided.

In addition, according to exemplary embodiments of the present disclosure, the composite electronic component capable of suppressing generation of noise in the driving power supply system may be provided.

Further, the deterioration phenomenon of the component by parasitic capacitance may be decreased by increasing a distance between the external terminals of the inductor and the capacitor.

In addition, in the composite electronic component according to an exemplary embodiment of the present disclosure, the deterioration in the Q factor of the component may be prevented by disposing the capacitor at the side surface of the inductor.

Furthermore, at the time of mounting the composite electronic component on the board, occurrence of the solder reflow defect may be prevented by increasing the distance between the external terminals of the inductor and the capacitor.

While exemplary embodiments have been illustrated and described above, it will be apparent to those skilled in the art that modifications and variations could be made without departing from the scope of the present invention as defined by the appended claims.

What is claimed is:

1. A composite electronic component comprising:
a composite body in which a capacitor and an inductor are coupled to each other, the capacitor including a ceramic body in which a plurality of dielectric layers and first and second internal electrodes disposed to face each other with respective dielectric layers interposed between the first and second internal electrodes are stacked, and the inductor including a magnetic body including a coil part;
an input terminal disposed on a first side surface of the composite body in a width direction of the composite body and connected to the coil part of the inductor;
an output terminal including a first output terminal disposed on the first side surface of the composite body in the width direction and connected to the coil part of the inductor and a second output terminal disposed on a first end surface of the composite body in a length direction of the composite body and connected to the first internal electrodes of the capacitor; and
a ground terminal disposed on a second end surface of the composite body in the length direction and connected to the second internal electrodes of the capacitor,
wherein the capacitor is coupled to a side surface of the inductor.

2. The composite electronic component of claim 1, wherein the magnetic body has a form in which a plurality of magnetic layers on which conductive patterns are disposed are stacked, the conductive patterns configuring the coil part.

3. The composite electronic component of claim 1, wherein the inductor has a thin film form in which the magnetic body includes an insulating substrate and coils disposed on at least one surface of the insulating substrate.

4. The composite electronic component of claim 1, wherein the magnetic body has a form in which the magnetic body includes a core and coils wound around the core.

5. The composite electronic component of claim 1, wherein the inductor is a power inductor.

6. The composite electronic component of claim 1, wherein the capacitor and the inductor are coupled to each other by a conductive adhesive.

7. A composite electronic component comprising:
a power stabilization part including a composite body in which a capacitor and an inductor are coupled to each other, the capacitor including a ceramic body in which a plurality of dielectric layers and first and second internal electrodes disposed to face each other with respective dielectric layers interposed between the first and second internal electrodes are stacked, the inductor including a magnetic body including a coil part, and the capacitor being coupled to a side surface of the inductor;
an input terminal disposed on a first side surface of the power stabilization part in a width direction of the power stabilization part and receiving power converted by a power management part; and
an output terminal including first and second output terminals disposed on the first side surface of the power stabilization part in the width direction and a first end surface of the power stabilization part in a length direction of the power stabilization part and supplying power stabilized by the power stabilization part,
wherein in a power stabilization electronic component used in a power terminal of a portable mobile device, suppressing an alternating current component of the received power, and decreasing ripples, the inductor suppresses the alternating current component of the received power, and the capacitor decreases ripples in the received power.

8. The composite electronic component of claim 7, further comprising a ground terminal disposed on a second end surface of the composite body in the length direction and connected to the second internal electrodes of the capacitor.

9. The composite electronic component of claim 7, wherein the magnetic body has a form in which a plurality of magnetic layers on which conductive patterns are disposed are stacked, the conductive patterns configuring the coil part.

10. The composite electronic component of claim 7, wherein the inductor has a thin film form in which the magnetic body includes an insulating substrate and coils disposed on at least one surface of the insulating substrate.

11. The composite electronic component of claim 7, wherein the magnetic body has a form in which the magnetic body includes a core and coils wound around the core.

12. The composite electronic component of claim 7, wherein the inductor is a power inductor.

13. The composite electronic component of claim 7, wherein the capacitor and the inductor are coupled to each other by a conductive adhesive.

14. A board having a composite electronic component, the board comprising:

a printed circuit board on which three or more electrode pads are disposed;

the composite electronic component of claim 1 mounted on the printed circuit board; and solders connecting the electrode pads and the composite electronic component to each other.

15. The board of claim 14, wherein the magnetic body has a form in which a plurality of magnetic layers on which conductive patterns are disposed are stacked, the conductive patterns configuring the coil part.

16. The board of claim 14, wherein the inductor has a thin film form in which the magnetic body includes an insulating substrate and coils disposed on at least one surface of the insulating substrate.

17. The board of claim 14, wherein the magnetic body has a form in which the magnetic body includes a core and coils wound around the core.

18. The board of claim 14, wherein the inductor is a power inductor.

19. The board of claim 14, wherein the capacitor and the inductor are coupled to each other by a conductive adhesive.

\* \* \* \* \*